United States Patent
Moon et al.

(10) Patent No.: US 7,143,336 B1
(45) Date of Patent: Nov. 28, 2006

(54) DECODING PARALLEL CONCATENATED PARITY-CHECK CODE

(75) Inventors: Jaekyun Moon, Plymouth, MN (US); Travis R. Oenning, Rochester, MN (US)

(73) Assignee: Regents of the Univerisity of Minnesota, Minneapolis, MN (US)

( * ) Notice: Subject to any disclaimer, the term of this patent is extended or adjusted under 35 U.S.C. 154(b) by 253 days.

(21) Appl. No.: 10/219,206

(22) Filed: Aug. 15, 2002

Related U.S. Application Data

(60) Provisional application No. 60/312,515, filed on Aug. 15, 2001.

(51) Int. Cl.
*G06F 11/00* (2006.01)
*H03M 13/00* (2006.01)

(52) U.S. Cl. .................. 714/804; 714/755
(58) Field of Classification Search ......... 714/752, 714/755, 758, 786, 804; 706/14
See application file for complete search history.

(56) References Cited

U.S. PATENT DOCUMENTS

| | | | |
|---|---|---|---|
| 4,295,218 A * | 10/1981 | Tanner | 714/762 |
| 6,023,783 A | 2/2000 | Divsalar et al. | |
| 6,145,110 A | 11/2000 | Khayrallah | |
| 6,381,713 B1 | 4/2002 | Irvin et al. | |
| 6,539,367 B1 * | 3/2003 | Blanksby et al. | 706/14 |

OTHER PUBLICATIONS

"Turbo Decoding as an Instance of Pearl's "Belief Propagation" Algorithm" by McEliece et al. IEEE, 1998.*
Bahl et al., "Optimal Decoding of Linear Codes for Minimizing Symbol Error Rate", IEEE Transactions on Information Theory, Mar. 1974, pp. 284-287.

Berrou et al., "Near Shannon Limit Error—Correcting Coding and Decoding: Turbo-Codes(1)", IEEE International Conference on Communications '93, May 23-26, 1993, Geneva, Switzerland, Technical Program, Conference Record, vol. 2/3, pp. 1064-1070.
Cheng et al., "Frequency-Efficient Coding with Low-Density Generator Matrices", working draft of Aug. 10, 1997.
Gallagher, "Low-Density Parity-Check Codes" M.I.T. Press (1963) pp. 1-90.
Kavcic, "Soft-Output Detector for Channels with Intersymbol Interference and Markov Noise Memory", Global Telecommunications Conference—Globecom '99, Dec. 5-9, 1999, Rio de Janeiro, Brazil, General Conference (Part B), Conference Record vol. 1 of 5—V01b, pp. 728-732.
Kim et al., "Improved Turbo Decoding through Belief Progagation", Global Telecommunications Conference—Globecom '99, Dec. 5-9, 1999, Rio de Janeiro, Brazil, Conference Record vol. 5 of 5—V05, pp. 2597-2601.
MacKay, "Good Error-Correcting Codes Based on Very Sparse Matrices", IEEE Transactions on Information Theory, vol. 45, No. 2, Mar. 1999, pp. 399-431.

(Continued)

*Primary Examiner*—Phung My Chung
(74) *Attorney, Agent, or Firm*—Mueting, Raasch, & Gebhardt, P.A.

(57) ABSTRACT

A decoding system and method for decoding parallel concatenated parity-check code defines a parity check matrix (e.g., a sparse parity check matrix) for the parallel concatenated parity check code. One or more bipartite graph representations are determined based on the parity check matrix with each of the one or more bipartite graph representations including bit nodes and check nodes. At least one of the one or more bipartite graph representations is decoded using an iterative decoding process (e.g., using an algorithm based on belief propagation).

30 Claims, 4 Drawing Sheets

OTHER PUBLICATIONS

MacKay et al., "Near Shannon Limit Performance of Low Density Parity Check Codes", Electronics Letters, Mar. 13, 1997, vol. 33, No. 6, pp. 457-458.

Moon et al., "Density Dependence of Noise in Thin Metallic Longitudinal Media", Journal of Applied Physics. 63(8), Apr. 15, 1988, pp. 3254-3256.

Moon, "SNR Definition for Magnetic Recording Channels with Transition Noise," to appear in IEEE Trans. Mag.

Moon et al., "Discrete-Time Modeling of Transition-Noise-Dominant Channels and Study of Detection Performance", IEEE Transactions of Magnetics, vol. 27, No. 6, Nov. 1991, pp. 4573-4578.

Moon et al., "Pattern Dependent Noise Prediction in Signal-Dependent Noise", IEEE J-SAC Special Issue on Signal Processing for High Density Storage Channels., vol. 19, pp. 730-743, Apr. 2001.

Oberg et al., "Parity Check Codes for Partial Response Channels", Global Telecommunications Conference, Globecom'99, Dec. 5-9, 1999, Rio de Janeiro, Brazil, General Conference (Part B) Conference Record, vol. 1-5—V01b, pp. 717-722.

Oenning et al., "Modeling the Lorentzian Magnetic Recording Channel with Transition Noise", IEEE Transactions on Magnetics, vol. 37, No. 1, Jan. 2001, pp. 583-591.

Oenning et al., "A Low Density Generator Matrix Interpretation of Parallel Concatenated Single Bit Parity Codes," TMRC 2000, Santa Clara, CA, Aug. 16, 2000.

Ping et al., "Iterative Decoding of Multi-Dimensional Concatenated Single Parity Check Codes", 1998 IEEE International Conference on Communications, Jun. 7-11, 1998, Atlanta, Georgia, USA, Conference Record, vol. 1 of 3, pp. 131-135.

Ryan, "Optimal Code Rates for Concatenated Codes on a PR4-Equalized Magnetic Recording Channel", IEEE Transactions on Magnetics, vol. 36. No. 6, Nov. 2000, pp. 4044-4049.

Ryan, "A Turbo Code Tutorial," unpublished.

Sawaguchi et al., "Turbo Decoding for High-Rate Concatenated Parity-Check Codes on PRML Channels", IEEE Transactions on Magnetics, vol. 36, No. 5, Sep. 2000, pp. 2173-2175.

Worthen et al., "Low-Density Parity Check Codes for Fading Channels with Memory", To appear in Proceedings of the 30$^{th}$ Annual Allerton Conference on Communication, Control and Computing, 1998. pp. 1-9.

TCM Theory "Theory of Trellis Coding". pp. 1-8 http://www.ece.wpi.edu/courses/ee535/hwk97/hwk3cd97/bad/theory.html.

* cited by examiner

DECODING PARALLEL CONCATENATED PARITY-CHECK CODE

This application claims the benefit of the U.S. Provisional Application Ser. No. 60/312,515, filed Aug. 15, 2001, which is incorporated herein by reference in its entirety.

BACKGROUND OF THE INVENTION

The present invention relates generally to encoding and decoding systems such as data storage systems, data communication systems, etc. More particularly, the present invention pertains to decoding techniques for use in such systems.

Turbo coding (e.g., as described in C. Berrou, A. Glavieux, and P. Thitimajshima, "Near shannon limit error-correcting coding and decoding: Turbo-codes," in *Proc. IEEE Intl. Conf. Commun.*, (Geneva), pp. 1064–70 (May 1993)) and low-density parity-check (LDPC) coding (e.g., as described in R. G. Gallager, *Low-Density Parity-Check Codes*, M.I.T. Press (1963) and D. J. C. MacKay and R. Neal, "Near shannon limit performance of low-density parity-check codes," *Electron. Lett.*, vol. 33, pp. 457–8 (March 1997)) are two powerful coding methods that have received considerable attention recently for their ability to offer large coding gains using practical iterative decoding methods. As first introduced, the encoding of turbo codes was generally much less complex than the encoding of LDPC codes, whereas, the decoding of LDPC codes was much less complex than the decoding of turbo codes. Generally, for example, the complexity referred to herein is measured in the number of mathematical operations required per bit, and does not account for the memory requirements needed in implementation.

Coding schemes have been used which combine the ideas of both turbo coding and LDPC coding. For example, in M. Oberg and P. H. Siegel, "Parity check codes for partial response channels," *Globecom, pp.* 717–722 (1999), a single bit parity-check code was used in a configuration similar to serial concatenated turbo coding. Further, parallel concatenated turbo coding was described in L. Ping, S. Chan, and K. L. Yeung, "Iterative decoding of multi-dimensional concatenated single parity check codes," *Proc. IEEE Intl. Conf Commun.*, vol. 1 of 3, pp. 131–35 (1998) and in H. Sawaguchi and J. K. Wolf, "Turbo decoding for high-rate concatenated parity-check codes on PRML channels," *IEEE Transactions on Magnetics*, vol. 36, No. 5, pp. 2173–75 (September 2000), which concatenates in parallel two single bit parity codes and decodes serially.

Data that is coded is typically received at a decoder. The task of a decoder is to reconstruct the original data source (e.g., bit stream) from the coded data, which may have been corrupted by noise.

Coding schemes utilizing both turbo coding and LDPC coding ideas generally result in a less complex encoding process. However, the process of decoding such code, as described in the articles by Ping, et al., and Sawaguchi, et al., is not as simple as is desired. As such, less complex decoding processes for such coding schemes are needed.

SUMMARY OF THE INVENTION

The present invention provides a less complex decoding system and process for decoding parallel concatenated parity-check code.

A method for decoding code according to the present invention includes providing parallel concatenated parity check code and defining a parity check matrix for the parallel concatenated parity check code. One or more bipartite graph representations are determined based on the parity check matrix with each of the one or more bipartite graph representations including bit nodes and check nodes. At least one of the one or more bipartite graph representations is decoded using an iterative decoding process (e.g., using an algorithm based on belief propagation).

In one embodiment of the method, parallel concatenated parity check code is provided using P parallel encoder paths (e.g., four or more) of different, randomly constructed, permutations of a plurality of blocks of systematic codeword bits. A single parity bit is generated for each of the plurality of blocks of systematic codeword bits.

In another embodiment of the method, defining a parity check matrix for the parallel concatenated parity check code includes defining a sparse parity check matrix. For example, such definition may include defining a parity check matrix that corresponds to an encoder structure using P parallel encoder paths to provide the parallel concatenated parity check code. Further, for example, the parity check matrix may include a parity check matrix H=[I P], where I is an identity matrix, and P is a plurality of sparse submatrices. Yet further, the plurality of submatrices may include N submatrices that each contain random zeroes and ones that each meet a same predetermined property.

In yet another embodiment of the method, determining one or more bipartite graph representations based on the parity check matrix may include providing a bipartite graph representation corresponding to all P parallel encoder paths, providing a bipartite graph representation corresponding to a single parallel encoder path, and/or providing a bipartite graph representation corresponding to a single bit parity block code.

A decoding apparatus for use in decoding parallel concatenated parity check code according to the present invention is also described. The apparatus is operable to define a parity check matrix (e.g., a sparse parity check matrix) for received parallel concatenated parity check code; to determine one or more bipartite graph representations based on the parity check matrix, each of the one or more bipartite graph representations including bit nodes and check nodes; and to decode at least one of the one or more bipartite graph representations using an iterative decoding process (e.g., using an algorithm based on belief propagation).

In one embodiment of the apparatus, the parity check matrix for the parallel concatenated parity check code may include a parity check matrix that corresponds to an encoder structure that uses P parallel encoder paths to provide the parallel concatenated parity check code, may include a parity check matrix H=[I P], where I is an identity matrix, and P is a plurality of sparse submatrices, and/or may include N submatrices that each contain random zeroes and ones that each meet a same predetermined property.

In another embodiment of the apparatus, the one or more bipartite graph representations based on the parity check matrix may include a bipartite graph representation corresponding to all P parallel encoder paths, a bipartite graph representation corresponding to a single parallel encoder path, and/or a bipartite graph representation corresponding to a single bit parity block code.

Another method for decoding code according to the present invention includes providing parallel concatenated single bit parity check code, defining a parity check matrix for the parallel concatenated single bit parity check code, and providing one or more bipartite graph representations based on the parity check matrix. Each of the one or more bipartite graph representations includes bit nodes and check nodes. The method further includes decoding at least one of the one or more bipartite graph representations using an algorithm based on belief propagation.

DETAILED DESCRIPTION OF THE EMBODIMENTS

The present invention shall be described with reference to FIGS. 1–5. In general, the present invention decodes data that is encoded by concatenating, in parallel, multiple single bit parity-check code using random interleavers. For example, the encoding structure is similar to structures proposed for encoding of parallel concatenated turbo codes, except the recursive systematic component codes of such turbo codes are replaced with single bit parity-check block codes.

Generally, decoding of such code can be viewed from a LDPC perspective by considering the parity-check matrix that corresponds to the encoding structure. The structure of the coding method allows for a large amount of flexibility in terms of decoding complexity and high speed hardware implementation trade-offs.

Figure 1:
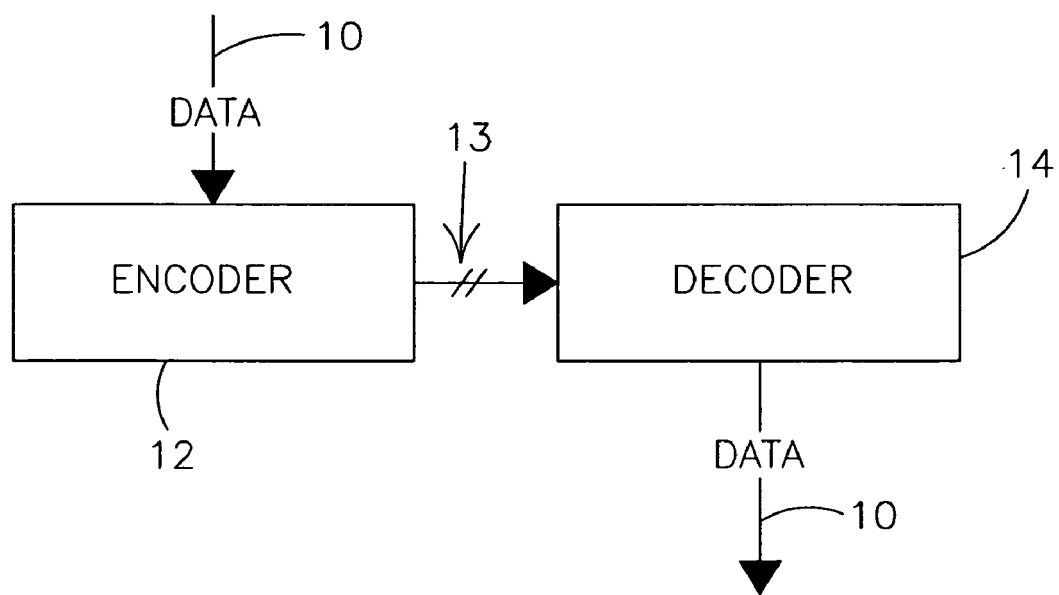
FIG. 1 is a general block diagram of a system including a decoder that operates upon coded data according to the present invention.

FIG. 1 shows a block diagram of a system or systems that include an encoder and corresponding decoder structure, i.e., encoder 12 and decoder 14. The encoder 12 receives data 10 and generates encoded data 13 (e.g., binary error correcting code) that is provided (e.g., transmitted, detected, or by some known manner) and which eventually is received by decoder 14. The decoder 14 reconstructs the original data 10 from the received code 13.

One skilled in the art will recognize that this is a simplified diagram to generally represent the encoder 12 and a corresponding decoder 14 suitable to decode encoded data provided by encoder 12. Systems that may incorporate such encoders and decoders are numerous and will not be set forth in detail herein. For example, such systems may include magnetic recording systems, wherein the data is encoded and recorded on media and then read and decoded, transmitter/receiver configurations, wireless communication systems, optical recording systems, etc. The present invention is not limited to any particular system described above but only as set forth in the attached claims.

Further, the present invention and/or one or more portions thereof may be implemented in hardware or software, or a combination of both. For example, the functions described herein may be designed in conformance with the principles set forth herein and implemented as one or more integrated circuits using a suitable processing technology, e.g., CMOS.

As another example, the present invention may be implemented using one or more computer programs executing on programmable computers, such as computers that include, for example, processing capabilities, data storage (e.g., volatile and nonvolatile memory and/or storage elements), input devices, and output devices. Program code and/or logic described herein is applied to input data to perform functionality described herein and generate desired output information. The output information may be applied as an input to one or more other devices and/or processes, in a known fashion.

Any program used to implement the present invention may be provided in a high level procedural and/or object orientated programming language to communicate with a computer system. Further, programs may be implemented in assembly or machine language. In any case, the language may be a compiled or interpreted language.

Any such computer programs may preferably be stored on a storage media or device (e.g., ROM or magnetic disk) readable by a general or special purpose program, computer, or a processor apparatus for configuring and operating the computer when the storage media or device is read by the computer to perform the procedures described herein. The system may also be considered to be implemented as a computer readable storage medium, configured with a computer program, where the storage medium so configured causes the computer to operate in a specific and predefined manner to perform functions described herein.

In view of the above, it will be readily apparent that the functionality as described herein may be implemented in any manner as would be known to one skilled in the art.

The encoder 12 may be any encoder structure that provides parallel concatenated parity-check (PCPC) code, e.g., parallel concatenated single bit parity code. The present invention is not limited to any particular encoder, however, various encoder structures providing code that can be advantageously decoded according to the present invention are described herein.

Figures 2, 3:
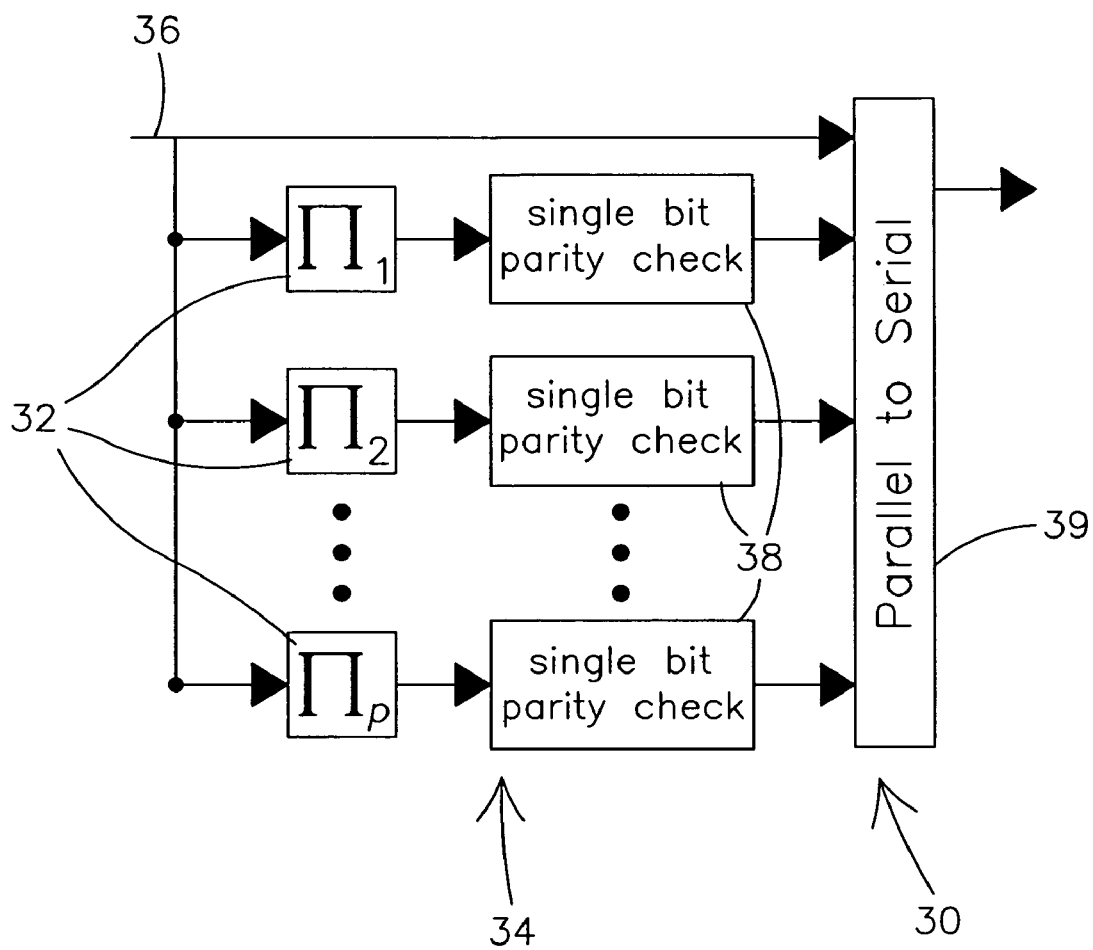
FIG. 2 shows a block diagram of one illustrative embodiment of an encoder for providing parallel concatenated signal bit parity codes according to the present invention.
FIG. 3 is a diagram used in illustrating another alternate embodiment of an encoding structure according to the present invention.

FIG. 2 shows a block diagram of one illustrative encoder structure 30 that provides PCPC code. Generally, the encoder structure 30 involves interleavers 32 in a manner similar to turbo code construction, as described in C. Berrou, A. Glavieux, and P. Thitimajshima, "Near shannon limit error-correcting coding and decoding: Turbo-codes," in *Proc. IEEE Intl. Conf. Commun.*, (Geneva), pp. 1064–70 (May 1993).

The parallel paths 34, as shown in FIG. 2, each employ different, randomly-constructed permutations of systematic codeword bits provided at input 36 and are concatenated using parallel to serial converter 39. The parity-check blocks 38 operate independently on blocks much smaller than the codeword size to generate single parity bits and enforce either an odd or even parity constraint.

For example, in one particular illustrative embodiment, the PCPC encoder structure 30 maps length K message bit sequences $s_i$ to $x_i$, where $x_i$ is a bit sequence of length N and $i=1,2,\ldots,2^K$. Encoding is systematic so that $x_i=(S_{i,1}, s_{i,2},\ldots,s_{i,K}, x_{i,K+1},\ldots,x_{i,N})$. Message bits are interleaved using P randomly (or otherwise) constructed interleavers 32 denoted by $\Pi_j$, $j=1,2,\ldots,P$ resulting in permuted sequences $(S_{i,\Pi_j(1)}, S_{i,\Pi_j(2)}, S_{i,\Pi_j(K)})$. After interleaving, parity-check block codes operating on k−1 bit blocks output single bits to enforce even (or odd) parity. Codeword lengths are chosen so that L=K/(k−1) is an integer. Using this notation, the length L parity bit sequence for interleaver path j is denoted as $p_j$. The overall code rate is, therefore, given by $(k-1)/(k-1+P)$, the component single bit parity-check codes have rate $(k-1)/k$, and $N=K+LP$.

The single bit parity check component code may be implemented in any suitable manner. For example, each of the single bit parity-check component codes can be efficiently implemented using a simple logical exclusive-OR operation.

Depending on the size of k, a single memory element with feedback to a modulo-2 adder, as shown in FIG. 3, may be a preferred alternative. In other words, for the single bit even parity check encoder implementation, the output is used and a zero is loaded every k−1 input bits. Likewise, for an odd parity check encoder, a one is loaded.

As an example of such encoding, consider a rate 8/9 code with block size N=4896. These code parameters correspond to uncoded bit blocks of K=4352. After scrambling rate 32/33, single bit parity-check codes operate on 136 subblocks; each block of size (k−1)=32. When four different permutation paths are used, this results in a total of L=544 parity bits being generated, and the desired code rate of 8/9.

From the perspective of timing recovery, it is desirable that the maximum number of consecutive coded bits with the same value be limited (e.g., run length limited) to some small number $k_{rii}+1$. An efficient method of run length limiting such code is to enforce odd parity on an encoder path that does not use any interleaving (assuming NRZI mapping of bits to current waveform). This modification is not expected to affect performance. For example, consider the following two situations: (1) Use a rate 16/17 outer code to enforce a run length constraint, and place parity bits generated from a PCPC code using four rate 32/33 component codes in such a way that maintains the smallest $k_{rii}$ value; and (2) Use four rate 23/24 odd parity component codes.

The benefit of the second approach is that it ensures a finite $k_{rii}$ value while incurring no extra rate loss penalty. In fact, the second method has the double benefit of a higher overall code rate while using lower rate component codes. For the code rates chosen above, the first approach will yield a lower $k_{rii}$ value. It should also be noted that the resulting code is no longer in a systematic form since the parity bits are placed throughout the codeword.

A variation of the second approach is to always put bit 1 in the middle of the corresponding sub-block of the unscrambled systematic bits. This extra bit then forces either even parity or odd parity in the sub-block. To convey the information on the enforced parity type to the decoder, another bit must be added to the sub-block. This will lower the overall code rate slightly. However, having bit 1 stuffed in every sub-block will decrease the $k_{rii}$ value. This approach is the same as stuffing (or appending) either 11 or 01 (10 can be used instead of 01) in every sub-block of unscrambled bits to enforce a given parity constraint.

It will be readily apparent to one skilled in the art that any encoder structure that provides PCPC code that can be decoded using the decoder described herein is suitable for use in conjunction with the present invention. For example, other implementations of such encoders have been described in various articles such as L. Ping, S. Chan, and K. L. Yeung, "Iterative decoding of multi-dimensional concatenated single parity check codes," *Proc. IEEE Intl. Conf. Commun.*, vol. 1 of 3, pp. 131–35 (1998) and H. Sawaguchi and J. K. Wolf, "Turbo decoding for high-rate concatenated parity-check codes on PRML channels," *IEEE Transactions on Magnetics*, vol. 36, No. 5, pp. 2173–75 (September 2000).

The encoder 12 can be described by a corresponding parity-check matrix which is part of the decoder 14. With use of the parity-check matrix to determine one or more bipartite graph representations of the code, decoding such code using an iterative decoding process can be performed to reconstruct the data (e.g., bit stream) encoded by the encoder 12.

Figure 4:
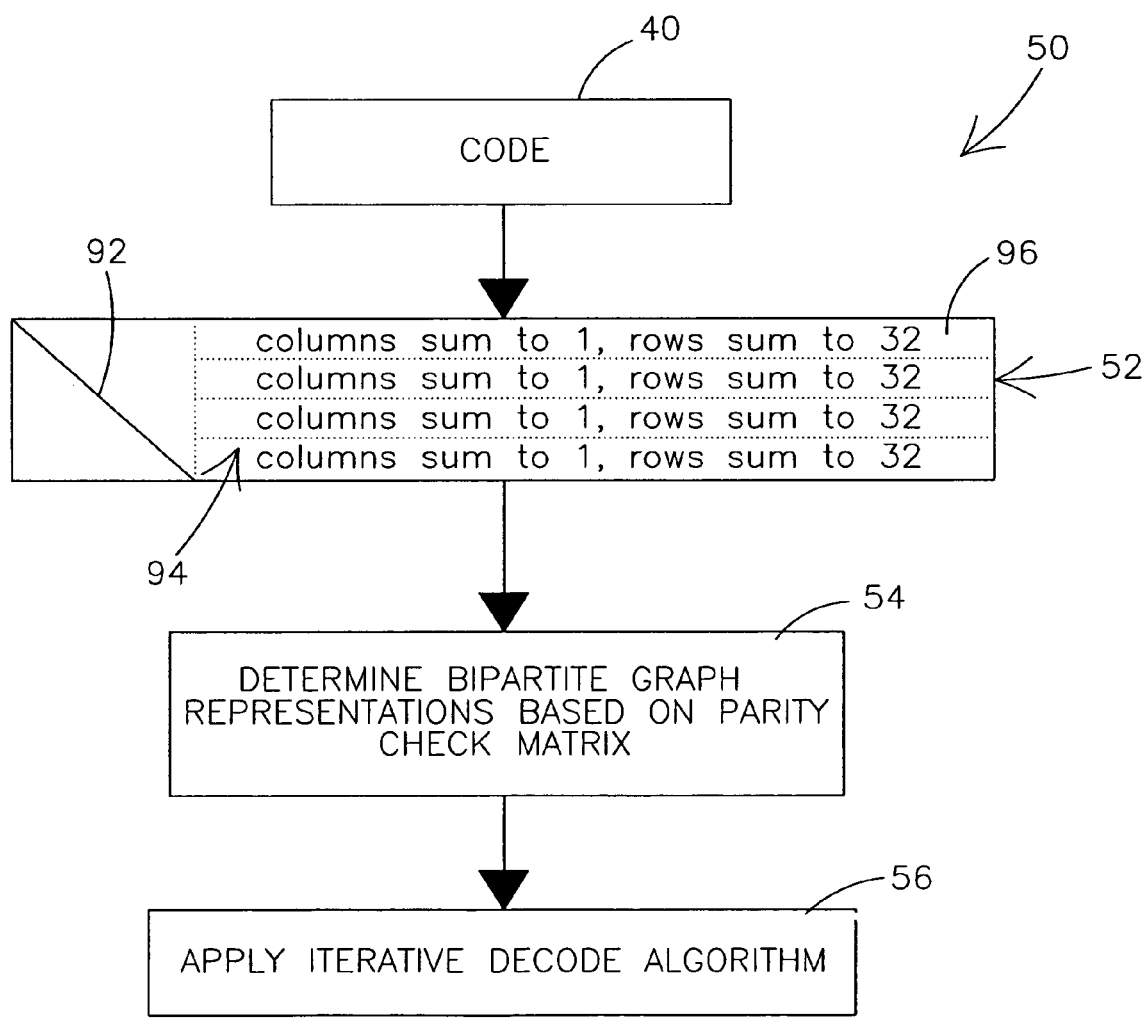
FIG. 4 is an illustrative general diagram showing a process including a structure of a parity-check matrix corresponding to an encoder structure for use in decoding coded data according to the present invention.

One illustrative embodiment of decoder 14 is provided by the decoder 50 shown in FIG. 4. Decoder 50 includes a parity-check matrix 52 for PCPC code 40, e.g., parallel concatenated single bit parity-check code, which is to be decoded.

The parity-check matrix 52 is used for the determination of one or more bipartite graph representations 54. As is known, such bipartite graph representations include bit nodes associated with check nodes, as shall be described further with reference to FIGS. 5A–5C.

With a bipartite graph representation 54 known for the parity-check matrix 52, any suitable iterative decoding algorithm may be applied (block 56) to decode the code 40. For example, as described in D. J. C. MacKay, "Good Error-Correcting Codes Based on Very Sparse Matrices," *IEEE Trans. On Information Theory*, Vol. 45, No. 2, pp. 399–431 (March 1999), a belief propagation algorithm may be used for decoding. In other words, the bipartite graph representation allows decoding of the PCPC code 40 using well-known belief propagation algorithms, just as in decoding of low-density parity-check (LDPC) codes as described, for example, in R. G. Gallager, *Low-Density Parity-Check Codes*, M.I.T. Press (1963).

The parity-check matrix 52 is a sparse low-density matrix allowing for less complexity in the decoding process. In addition, the generator matrix is sparse, as well.

Generally, at least in one exemplary embodiment, the structure of the parity-check matrix 52 is shown in FIG. 4. The largest rectangular box represents the parity-check matrix 52 and rectangular boxes inside represent submatrix partitions 94. The diagonal 92 in the box on the left represents an identity matrix. Four other additional-submatrices 94 each contain random 0's and 1's, where each meet a same predetermined property, e.g., the columns sum to a particular value and the rows sum to a particular value, of the submatrix. Note that the submatrices are sparse matrices, i.e., the number of 1's is considerably less than the number of 0's.

In continuation of the example previously provided with regard to the encoder structure 30, the parity-check matrix which corresponds to the encoding structure 30 described herein is a parity-check matrix H given by H=[I P], where I denotes an identity matrix, and P is given by $P^T=[H_1\ H_2\ \ldots\ H_P]$. $H_i$ for $i=1,2,\ldots,P$ is an all zeros matrix, except for a sparse number of ones in the positions described below. Row r of $H_i$ contains ones in column positions determined by:

$$\Pi_i(S[(r-1)(k-1)+1, r(k-1)])$$

where S[a,b] is used to denote the set of integers from a to b, that is $S[a,b]=a, a+1, \ldots, b$. H is already in systematic form so that the generator matrix G is given by $G^T=[P\ I]$, where $x_i = G s_i$.

The specific structure of the parity-check matrix 52 depicted in FIG. 4 corresponds to a rate 8/9 code with P=4. Again, note that not only is the parity-check matrix sparse (low-density), but the generator matrix is sparse as well. Further, one skilled in the art will recognize that this structure for the parity check matrix may be adapted for other corresponding coding structures.

Figure 5A:
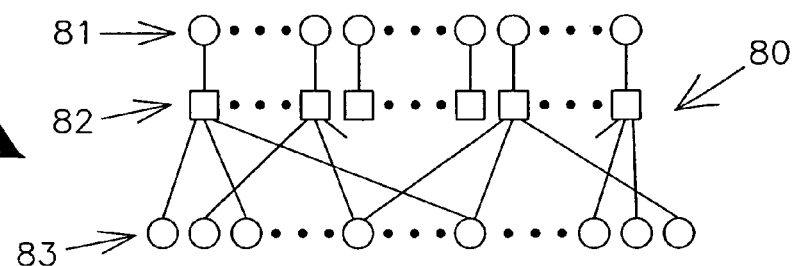
FIGS. 5A–5C are bipartite graph representations of the coded data determined based on a parity-check matrix, such as that shown in the diagram of FIG. 4, according to the present invention.
Figure 5B:
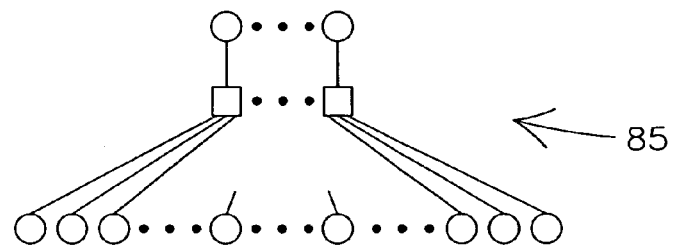
Figure 5C:
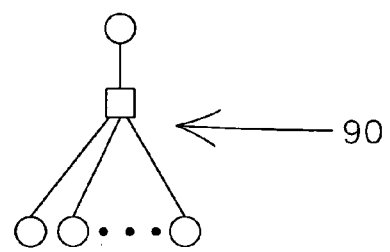

One or more bipartite graph representations 54 can be determined based on the parity-check matrix 52. For example, several of such bipartite graph representations are shown in FIGS. 5A–5C. The bipartite graph representations of PCPC code is used for decoding, e.g., application of an iterative decode algorithm (block 56 as shown in FIG. 4).

For example, as shown in FIG. 5A, a bipartite graph representation for the entire code (where the code uses three interleaved encoder paths) is shown by bipartite graph representation 80. Nodes of the graph are shown with check nodes 82 connecting bit nodes 81, 83. In other words, the nodes 82 drawn as boxes correspond to the check nodes and nodes 81, 83 drawn as circles correspond to bit nodes. Bit nodes 83 drawn below check nodes 82 correspond to systematic bits, and those bit nodes 81 drawn above check nodes 82 correspond to parity bits.

FIG. 5B shows a bipartite graph representation 85 which corresponds to a single encoding path P with bit nodes appropriately reordered. FIG. 5C shows a bipartite graph representation 90 corresponding to a single bit parity-check block code.

With the bipartite graph representations provided in one of the forms as described above, an iterative decode algorithm can be applied, as previously mentioned with reference to block 56 of FIG. 4. Preferably, such iterative decode algorithm is based on belief propagation, however, other iterative decode processes may be used. For example, various iterative decoding processes are described in the art, such as in the article by L. Ping, S. Chan, and K. L. Yeung, "Iterative decoding of multi-dimensional concatenated single parity-check codes," *Proc. IEEE Intl. Conf. Commun.* (1998); H. Sawaguchi and J. K. Wolf, "Turbo decoding for high-rate concatenated parity-check codes on PRML channels," *IEEE Transactions on Magnetics*, vol. 36, No. 5, pp. 2173–75 (September 2000); L. R. Bahl, J. Cocke, F. Jelinek, and J. Raviv, "Optimal decoding of linear codes for minimizing symbol error rate," *IEEE Trans. Info. Theory*, vol. 20, pp. 248–87(March 1974); and S. Kim and S. B. Wicker, "Improved turbo decoding through belief propagation," *Globecom*, pp. 2597–2601 (1999). As such, iterative decode algorithms are clearly known to those of skill in the art, and they will not be described in further detail herein. One skilled in the art having a bipartite graph representation is able to apply a suitable algorithm.

In one particular exemplary embodiment, decoding can be thought of as message passing on a bipartite graph representation of the parity-check matrix. The graph is obtained by drawing a node for every column and row of the parity-check matrix, which are referred to as check and bit nodes, respectively, as described above. The nodes are connected with edges in correspondence with ones in the parity-check matrix.

Decoding can be performed as follows. First, a priori information $\lambda_i^0 = \log(P(x_i=1)/P(x_i=0))$ is obtained from the channel decoder, and values associated with every edge in the graph $C_{m,i}^0$ are initialized to zero. For iteration l, each check node indexed by m and every edge from that check node is updated according to:

$$C_{mi}^l = 2(-1)^{\Sigma_l H_{ml}} \tanh^{-1}\left(\prod_{l' \neq l} \tanh[(\lambda_{l'}^{L-1} - C_{ml'}^{-1})/2]\right)$$

The last step in each iteration is to compute an updated log a posteriori (APP) ratio for each bit according to $\lambda_i^l = \lambda_i^0 + \Sigma_i C_{ti}^i$. Decoding iterations using such update equations can stop when a valid codeword has been reached.

A wide variety of decoder implementation options are available because of the various manners of determining the bipartite graph representations as shown in FIGS. 5A–5C. For example, FIG. 5A shows a bipartite graph representation corresponding to a code using three interleaved paths (P=3). A decoding algorithm described above can be used directly on this graph in a highly parallel manner. That is, a separate processing unit may be used at each node in the graph and run in parallel. Doing this allows for an extremely high-speed implementation at the cost of implementing a very large number of parallel processing units. Of course, decoding can also be done in a serial fashion on the bipartite graph of FIG. 5A.

Using appropriate (e.g., according to corresponding encoder interleaving) re-ordering of systematic bit nodes 83, the graph in FIG. 5A can be drawn as P separate graph representations, like that shown in FIG. 5B. Using this decomposition, various decoding methods similar to those developed for turbo decoding can be used, such as those described in C. Berrou, et al., "Near shannon limit error-correcting coding and decoding: Turbo-codes," *Proc. IEEE Intl. Conf. Commun.*, (Geneva), pp. 1064–70 (May 1993). That is, APP modules that decode based on the graph of FIG. 5B can be arranged, for example, in a serial, pipelined, or parallel fashion exactly as has been proposed for turbo decoding.

The graph representation in FIG. 5B can be further broken down into L separate graphs, like that shown in FIG. 5C. APP decoding for this graph representation can be efficiently realized using the forward-backward algorithm on a k stage 2-state trellis with the same start and end state as described in L. R. Bahl, et al., "Optimal decoding of linear codes for minimizing symbol error rate," *IEEE Trans. Inform.* Theory, vol. 20, pp. 284–287 (March 1974). Alternatively, the update equations shown above indicate these L decoders can also be done in either a serial or parallel fashion, thereby increasing the number of implementation option combinations even further.

Not all of the aforementioned decoding options are equivalent. As such, they can behave differently and result in different levels of performance.

The bit error rate (BER) curves for code as described above obtained based on conventional turbo decoding methods clearly show the familiar error floor effect (see L. Ping, S. Chan, and K. L. Yeung, "Iterative decoding of multi-dimensional concatenated single parity-check codes," in *Proc. IEEE Intl. Conf. Commun.*, 1998). However, the same code decoded using belief propagation, based on the parity-check matrix representation according to the present invention, exhibits no error floor. Results of the performance of a PCPC code with P=4 are nearly identical to that of LDPC codes constructed with an overlap constraint and column weight of four. As such, P is preferably 4. Generally, no error flooring effect is seen down to error rates, such as $10^{-4}$.

All references cited herein are incorporated in their entirety as if each were incorporated separately. This invention has been described with reference to illustrative embodiments and is not meant to be construed in a limiting sense. Various modifications of the illustrative embodiments, as well as additional embodiments of the invention, will be apparent to persons skilled in the art upon reference to this description.

What is claimed is:

1. A method for decoding code, the method comprising:
   providing parallel concatenated parity check code;
   defining a parity check matrix for the parallel concatenated parity check code;
   determining one or more bipartite graph representations based on the parity check matrix, each of the one or more bipartite graph representations comprising bit nodes and check nodes; and
   decoding at least one of the one or more bipartite graph representations using an iterative decoding process.

2. The method of claim 1, wherein decoding at least one of the one or more bipartite graph representations using an iterative decoding process comprises decoding at least one of the one or more bipartite graph representations using an algorithm based on belief propagation.

3. The method of claim 1, wherein providing parallel concatenated parity check code comprises:
   providing P parallel encoder paths of different, randomly constructed, permutations of a plurality of blocks of systematic codeword bits; and
   generating a single parity bit for each of the plurality of blocks of systematic codeword bits.

4. The method of claim 3, wherein P is four or more.

5. The method of claim 1, wherein defining a parity check matrix for the parallel concatenated parity check code comprises defining a sparse parity check matrix.

6. The method of claim 5, wherein defining a parity check matrix for the parallel concatenated parity check code comprises defining a parity check matrix that corresponds to an encoder structure using P parallel encoder paths to provide the parallel concatenated parity check code.

7. The method of claim 6, wherein the parity check matrix comprises a parity check matrix H=[I P], where I is an identity matrix, and P is a plurality of sparse submatrices.

8. The method of claim 7, wherein the plurality of submatrices comprise N submatrices that each contain random zeroes and ones that each meet a same predetermined property.

9. The method of claim 6, wherein determining one or more bipartite graph representations based on the parity check matrix comprises providing a bipartite graph representation corresponding to all P parallel encoder paths.

10. The method of claim 6, wherein determining one or more bipartite graph representations based on the parity check matrix comprises providing a bipartite graph representation corresponding to a single parallel encoder path.

11. The method of claim 6, wherein determining one or more bipartite graph representations based on the parity check matrix comprises providing a bipartite graph representation corresponding to a single bit parity block code.

12. A decoding apparatus for use in decoding parallel concatenated parity check code, the apparatus comprising:
    means for defining a parity check matrix for received parallel concatenated parity check code;
    means for determining one or more bipartite graph representations based on the parity check matrix, each of the one or more bipartite graph representations comprising bit nodes and check nodes; and
    means for decoding at least one of the one or more bipartite graph representations using an iterative decoding process.

13. The apparatus of claim 12, wherein the means for decoding at least one of the one or more bipartite graph representations using an iterative decoding process comprises means for decoding at least one of the one or more bipartite graph representations using an algorithm based on belief propagation.

14. The apparatus of claim 12, wherein the parity check matrix for the parallel concatenated parity check code comprises a sparse parity check matrix.

15. The apparatus of claim 14, wherein the parity check matrix for the parallel concatenated parity check code comprises a parity check matrix that corresponds to an encoder structure that uses P parallel encoder paths to provide the parallel concatenated parity check code.

16. The apparatus of claim 15, wherein the parity check matrix comprises a parity check matrix H=[I P], where I is an identity matrix, and P is a plurality of sparse submatrices.

17. The apparatus of claim 16, wherein the plurality of submatrices comprise N submatrices that each contain random zeroes and ones that each meet a same predetermined property.

18. The apparatus of claim 15, wherein the one or more bipartite graph representations based on the parity check matrix comprises a bipartite graph representation corresponding to all P parallel encoder paths.

19. The apparatus of claim 15, wherein the one or more bipartite graph representations based on the parity check matrix comprises a bipartite graph representation corresponding to a single parallel encoder path.

20. The apparatus of claim 15, wherein the one or more bipartite graph representations based on the parity check matrix comprises a bipartite graph representation corresponding to a single bit parity block code.

21. A method for decoding code, the method comprising:
    providing parallel concatenated single bit parity check code;
    defining a parity check matrix for the parallel concatenated single bit parity check code;
    providing one or more bipartite graph representations based on the parity check matrix, each of the one or more bipartite graph representations comprising bit nodes and check nodes; and
    decoding at least one of the one or more bipartite graph representations using an algorithm based on belief propagation.

22. The method of claim 21, wherein providing parallel concatenated single bit parity check code comprises:
    providing P parallel encoder paths of different, randomly constructed, permutations of a plurality of blocks of systematic codeword bits; and
    generating a single parity bit for each of the plurality of blocks of systematic codeword bits.

23. The method of claim 22, wherein P is four or more.

24. The method of claim 21, wherein defining a parity check matrix for the parallel concatenated single bit parity check code comprises defining a sparse parity check matrix.

25. The method of claim 21, wherein defining a parity check matrix for the parallel concatenated parity check code comprises defining a parity check matrix that corresponds to an encoder structure using P parallel encoder paths to provide the parallel concatenated single bit parity check code.

26. The method of claim 25, wherein the parity check matrix comprises a parity check matrix H=[I P], where I is an identity matrix, and P is a plurality of sparse submatrices.

27. The method of claim 26, wherein the plurality of submatrices comprise N submatrices that each contain random zeroes and ones that each meet a same predetermined property.

28. The method of claim 25, wherein determining one or more bipartite graph representations based on the parity check matrix comprises providing a bipartite graph representation corresponding to all P parallel encoder paths.

29. The method of claim 25, wherein determining one or more bipartite graph representations based on the parity check matrix comprises providing a bipartite graph representation corresponding to a single parallel encoder path.

30. The method of claim 25, wherein determining one or more bipartite graph representations based on the parity check matrix comprises providing a bipartite graph representation corresponding to a single bit parity block code.

* * * * *